(12) United States Patent
Matsumoto et al.

(10) Patent No.: US 7,376,040 B2
(45) Date of Patent: May 20, 2008

(54) BACKUP CIRCUIT FOR HOLDING INFORMATION IN A STORAGE CIRCUIT WHEN POWER CUT-OFF OCCURS

(75) Inventors: Masahiro Matsumoto, Hitachi (JP); Keiji Hanzawa, Mito (JP); Hiroyasu Sukesako, Hitachinaka (JP)

(73) Assignees: Hitachi, Ltd., Tokyo (JP); Hitachi Car Engineering Co., Ltd., Hitachinaka-shi (JP)

( * ) Notice: Subject to any disclaimer, the term of this patent is extended or adjusted under 35 U.S.C. 154(b) by 0 days.

(21) Appl. No.: 10/563,580

(22) PCT Filed: Sep. 18, 2003

(86) PCT No.: PCT/JP03/11894

§ 371 (c)(1),
(2), (4) Date: Jan. 6, 2006

(87) PCT Pub. No.: WO2005/029675

PCT Pub. Date: Mar. 31, 2005

(65) Prior Publication Data
US 2006/0158036 A1 Jul. 20, 2006

(51) Int. Cl.
*G11C 5/14* (2006.01)
(52) U.S. Cl. ........................... 365/229; 365/228
(58) Field of Classification Search ............. 365/229
See application file for complete search history.

(56) References Cited

U.S. PATENT DOCUMENTS

| | | | | |
|---|---|---|---|---|
| 4,227,257 A | * | 10/1980 | Sato | 455/343.1 |
| 4,365,316 A | * | 12/1982 | Iwahashi et al. | 365/72 |
| 4,587,640 A | * | 5/1986 | Saitoh | 365/229 |
| 4,795,914 A | * | 1/1989 | Higa et al. | 307/64 |
| 5,016,223 A | * | 5/1991 | Kimura et al. | 365/229 |
| 5,118,962 A | * | 6/1992 | Ishii et al. | 307/64 |
| 5,428,252 A | * | 6/1995 | Walker et al. | 307/64 |
| 6,252,312 B1 | * | 6/2001 | Hubert et al. | 307/64 |
| 2004/0090120 A1 | * | 5/2004 | Lamberg et al. | 307/9.1 |

FOREIGN PATENT DOCUMENTS

| | | |
|---|---|---|
| JP | 5-276688 | 10/1993 |
| JP | 2638257 | 4/1997 |

(Continued)

OTHER PUBLICATIONS

Chinese Office Action dated Jun. 29, 2007 with English Translation (Five (5) pages).

*Primary Examiner*—Son L. Mai
(74) *Attorney, Agent, or Firm*—Crowell & Moring LLP

(57) ABSTRACT

A backup circuit that can be fabricated by the standard CMOS process and has a small circuit scale. The backup circuit (10) is disposed between a digital circuit (20) including a storage circuit and a power supply terminal ($T_{IN}$, $T_{GND}$) for supplying power to the digital circuit. MOS transistors (MOS1, MOS2) connected in series are disposed between the power supply terminal ($T_{IN}$, $T_{GND}$) and a backup capacitor (C1). The MOS transistors (MOS1, MOS2) serve as resistors when the power is normally supplied to the power supply terminal, and as diodes each operating with its backward direction defined as the direction from the digital circuit toward the power supply terminal when the power is cut off.

8 Claims, 3 Drawing Sheets

FOREIGN PATENT DOCUMENTS

| | | |
|---|---|---|
| JP | 9-322429 | 12/1997 |
| JP | 10-285832 | 10/1998 |
| JP | 2001-28845 | 1/2001 |
| JP | A 2001-327101 | 11/2001 |
| JP | 3363360 | 10/2002 |
| JP | 2003-258113 | 9/2003 |

* cited by examiner

BACKUP CIRCUIT FOR HOLDING INFORMATION IN A STORAGE CIRCUIT WHEN POWER CUT-OFF OCCURS

TECHNICAL FIELD

The present invention relates to a backup circuit for holding information stored in a storage circuit within a digital circuit when source power is cut off, and more particularly to a backup circuit capable of being fabricated by the standard CMOS process.

BACKGROUND ART

In one known digital circuit, as disclosed in, e.g., JP-A-2001-327101, a backup circuit constituted by a backup capacitor is disposed between a power supply terminal and the digital circuit. When a voltage is supplied from the power supply terminal, the backup capacitor is charged, and when no voltage is supplied upon power cutoff, a voltage is supplied to the digital circuit with electrical charges that have been charged in the backup capacitor, thereby holding information stored in the storage circuit.

Then, to prevent the voltage charged in the backup capacitor from being supplied to the exterior from the power supply terminal, it is known to dispose a diode between the power supply terminal and the backup capacitor. An anode of the diode is connected to the power supply terminal, and a cathode of the diode is connected to one terminal of the backup capacitor. A current is thereby prevented from flowing backward from the backup capacitor toward the power supply terminal when the voltage supplied from the power supply terminal drops.

In the case using the diode, however, some special process, such as the SOI process, is required because the standard CMOS process cannot be used to constitute the diode and the digital circuit on the same LSI chip. Accordingly, when the digital circuit is constituted by using the standard CMOS process, a problem arises in that the diode must be formed as an external device. Another problem with the use of the diode is that the diode causes a voltage drop even during the normal operation.

On the other hand, it is also known to use, instead of a diode, a MOS transistor driven by an oscillator and a charge pump. In this known related art, the oscillator is driven by a voltage supplied from a power supply terminal, and the charge pump is driven by an output of the oscillator. Further, an anode of the MOS transistor is connected to the power supply terminal, and a cathode of the MOS transistor is connected to one terminal of the backup capacitor. An output of the charge pump is supplied to a gate of the MOS transistor. When the voltage supplied from the power supply terminal drops, the oscillator is stopped to reduce the voltage applied from the charge pump to the gate of the MOS transistor, whereby the MOS transistor is turned off to prevent a current from flowing backward from the backup capacitor toward the power supply terminal. Since a backup circuit having such an arrangement can be fabricated by the standard CMOS process, the backup circuit can be integrated on the same semiconductor chip as the digital circuit, and a voltage drop hardly occurs.

DISCLOSURE OF THE INVENTION

However, the backup circuit using the oscillator, the charge pump, and the MOS transistor has the problem that about 15 transistor devices are required to constitute the oscillator and the charge pump, and a circuit scale is increased with a larger number of devices required.

An object of the present invention is to provide a backup circuit that can be fabricated by the standard CMOS process and has a small circuit scale.

(1) To achieve the above object, according to the present invention, in a backup circuit disposed between a digital circuit including a storage circuit and a power supply terminal for supplying power to the digital circuit, and including a backup capacitor for supplying a backup voltage to the digital circuit when the power is cut off, thereby holding information stored in the storage circuit, the backup circuit includes devices which are capable of being formed by a standard CMOS process, which are disposed between the power supply terminal and the backup capacitor, and which serve as resistors when the power is normally supplied to the power supply terminal, and as diodes each operating with a backward direction thereof defined as the direction from the digital circuit toward the power supply terminal when the power is cut off.

With those features, the backup circuit can be fabricated by the standard CMOS process, and the circuit scale can be reduced.

(2) In above (1), preferably, the devices are MOS transistors, and gate terminals of the MOS transistors are connected to a ground potential.

(3) In above (2), preferably, the MOS transistors are connected in series in plural number.

(4) In above (1), preferably, the backup circuit further comprises shift means for shifting the digital circuit to a power low-consumption state when a voltage at the power supply terminal drops to a level not higher than a predetermined voltage.

(5) In above (4), preferably, the shift means is voltage detecting means for detecting the voltage at the power supply terminal and shifting the digital circuit to a standby state when the voltage at the power supply terminal drops to a level not higher than the predetermined voltage.

(6) In above (4), preferably, the shift means is an oscillator driven by the voltage supplied from the power supply terminal, driving the digital circuit with a clock signal outputted from the oscillator, and stopping oscillation when the voltage supplied from the power supply terminal drops to a predetermined voltage.

(7) In above (1), preferably, the backup circuit further comprises reset means for resetting the digital circuit when a voltage at the power supply terminal drops to a level not higher than a predetermined voltage.

(8) In above (7), preferably, the reset means resets the digital circuit with a delay of a predetermined time after the voltage at the power supply terminal has dropped to a level not higher than the predetermined voltage.

BEST MODE FOR CARRYING OUT THE INVENTION

The configuration and operation of a backup circuit according to a first embodiment of the present invention will be described below with reference to FIGS. 1-4.

Figure 1:
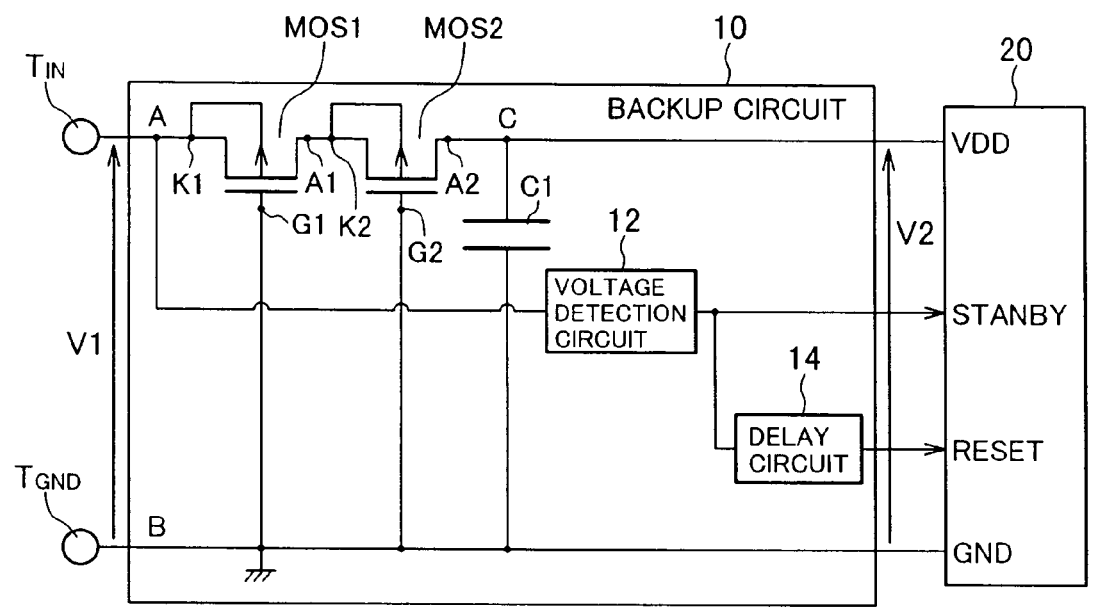
FIG. 1 is a circuit diagram showing the configuration of a backup circuit according to a first embodiment of the present invention.

A description is first made of the configuration of the backup circuit of this embodiment with reference to FIG. 1.

FIG. 1 is a circuit diagram showing the configuration of the backup circuit according to the first embodiment of the present invention.

A backup circuit 10 comprises p-MOS transistors MOS1, MOS2 connected in series, a backup capacitor C1, a voltage detection circuit 12, and a delay circuit 14.

A cathode terminal K1 of the MOS transistor MOS1 is connected to a power supply terminal $T_{IN}$. An anode terminal A1 of the MOS transistor MOS1 is connected to the cathode terminal K2 of the MOS transistor MOS2. A gate terminal G1 of the MOS transistor MOS1 is connected to a power supply terminal $T_{GND}$. The power supply terminal $T_{GND}$ is at a ground potential. An external power source is connected to the power supply terminals $T_{IN}$, $T_{GND}$ for supply of a voltage V1.

The cathode terminal K2 of the MOS transistor MOS2 is connected to the anode terminal A1 of the MOS transistor MOS1. An anode terminal A2 of the MOS transistor MOS2 is connected to a power supply terminal VDD of a digital circuit 20. A gate terminal G2 of the MOS transistor MOS2 is connected to the power supply terminal $T_{GND}$. With such an arrangement, the MOS transistors MOS1, MOS2 are connected in series between the power supply terminal $T_{IN}$ and the power supply terminal VDD of the digital circuit 20.

As described in detail later with reference to FIG. 2, the p-MOS transistors MOS1, MOS2 serve as resistors when the power is normally supplied from the exterior, and as diodes each operating with its backward direction defined as the direction from the digital circuit 20 toward the power supply terminal $T_{IN}$ when the power is cut off.

One terminal of the backup capacitor C1 is connected to a junction between the anode terminal A2 of the MOS transistor MOS2 and the power supply terminal VDD of the digital circuit 20. Another terminal of the backup capacitor C1 is connected to the power supply terminal $T_{GND}$. The backup capacitor C1 is charged with the source voltage that is supplied from the power supply terminal $T_{IN}$, $T_{GND}$ to the power supply terminal VDD of the digital circuit 20.

The voltage detection circuit 12 detects the voltage between the power supply terminals $T_{IN}$ and $T_{GND}$ and generates a signal for shifting the digital circuit 20 to a low-power state (standby state). An output of the voltage detection circuit 12 is inputted to a standby terminal STANBY of the digital circuit 20. When an input signal at the standby terminal STANBY of the digital circuit 20 takes a high level, the digital circuit 20 stops the supply of the power to a CPU (computing unit), etc. included in the digital circuit 20 and is shifted to the low-power state. At this time, a storage device, such as a ROM, in the digital circuit 20 holds information stored therein with the voltage supplied from the power supply terminal VDD of the digital circuit 20.

The delay circuit 14 generates a delay signal for delaying an output signal of the voltage detection circuit 12. An output signal of the delay circuit 14 is supplied to a reset terminal RESET of the digital circuit 20. When an input signal at the reset terminal RESET changes from a low level to a high level, the digital circuit 20 resets the CPU, etc. therein so that the operation of the digital circuit 20 is restored.

The sectional structure of the MOS transistor used in the backup circuit of this embodiment will be described below with reference to FIG. 2.

Figure 2:
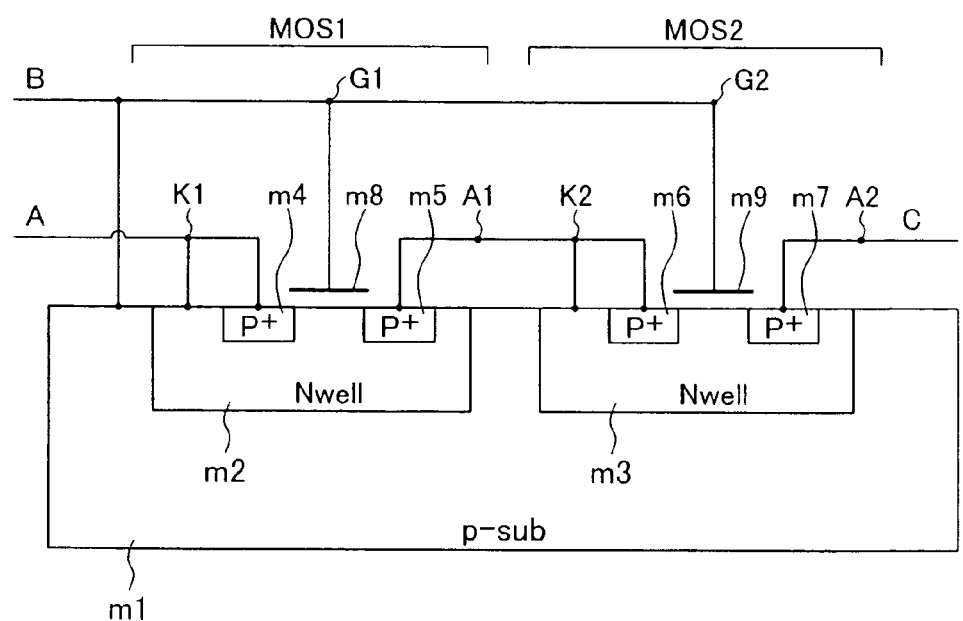
FIG. 2 is a sectional view showing the sectional structure of a MOS transistor used in the backup circuit according to the first embodiment of the present invention.

FIG. 2 is a sectional view showing the sectional structure of the MOS transistor used in the backup circuit according to the first embodiment of the present invention. Note that the same reference numerals as those in FIG. 1 denote the same components.

The p-MOS transistors MOS1, MOS2 are constituted by forming N-WELLs m2, m3 in a P-SUB substrate m1 to be separate from each other, and forming P+ diffusions m4, m5; m6, m7 and gate electrodes m8, m9 in the N-WELLs m2, m3, respectively. In other words, those MOS transistors can be fabricated by the standard CMOS process.

The operation of the backup circuit of this embodiment will be described below with reference to FIGS. 1 and 3.

Figure 3:
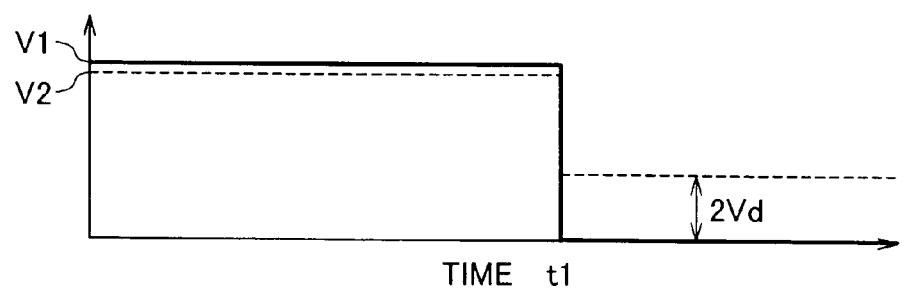
FIG. 3 is a chart for explaining the operation of the backup circuit according to the first embodiment of the present invention.

FIG. 3 is a chart for explaining the operation of the backup circuit according to the first embodiment of the present invention.

In the backup circuit 10 shown in FIG. 1, because the gate terminals of the MOS transistors MOS1, MOS2 are connected to the ground potential in the normal state, the MOS transistors MOS1, MOS2 are in the turned-on state and function as small resistances during the normal operation. Therefore, the MOS transistors MOS1, MOS2 supply the voltage applied between the power supply terminals $T_{IN}$, $T_{GND}$ to the digital circuit 20 without causing a noticeable voltage drop. Assuming here that a resistance resulting when one MOS transistor is in the turned-on state is 2 Ω, a resistance value of the two MOS transistors MOS1, MOS2 is 4 Ω. Assuming that a current flowing through the MOS transistors MOS1, MOS2 is 10 mA, a voltage drop in the MOS transistors MOS1, MOS2 is just 0.04 V.

During the normal operation, therefore, a voltage V2 supplied to the power supply terminal VDD of the digital circuit 20 is just about 0.04 V lower than the external voltage V1 supplied between the power supply terminals $T_{IN}$ and $T_{GND}$, as shown in FIG. 3.

On the other hand, when the power is cut off, the MOS transistor MOS2 does not operate as a MOS transistor, but it operates as a diode with the functions of the P+ diffusion m7 and the N-WELL m3. Similarly, the MOS transistor MOS1 operates as a diode with the functions of the P+ diffusion m5 and the N-WELL m2.

Accordingly, as shown in FIG. 3, when the power is cut off at a time t1, the voltage V2 supplied to the digital circuit 20 is maintained at a voltage 2 Vd (about 1.2 V), which corresponds to two diodes each having a forward voltage Vd, in spite of that the voltage V1 supplied between the power supply terminals $T_{IN}$ and $T_{GND}$ becomes 0 V. In general, a storage device in the digital circuit 20 is constituted by, e.g., flip-flops and a RAM, and the storage device is able to maintain information even when the source voltage is reduced to about 0.5 V. In other words, by keeping the voltage V2 supplied to the digital circuit 20 at a voltage of about 1.2 V, which corresponds to twice the forward voltage of one diode, the backup circuit 10 of this embodiment enables the information stored in the flip-flops and the RAM inside the digital circuit 20 to be maintained as it is. Thus, the digital circuit 20 can also be normally operated after the restoration of the power from the cutoff state.

Because the storage device is generally able to maintain information even when the source voltage is reduced to about 0.5 V, the backup circuit may include only one MOS transistor from that point of view. In practice, however, the voltage at which each storage device is able to maintain information is changed due to variations caused during the manufacturing process. For that reason, in this embodiment, two MOS transistors are connected in series to keep the source voltage at about 1.2 V so that the information can be maintained regardless of individual variations among the storage devices.

With this embodiment, as described above, the p-MOS transistors MOS1, MOS2, which serve as resistors when the power is normally supplied from the exterior and as diodes each operating with its backward direction defined as the direction from the digital circuit 20 toward the power supply terminal $T_{IN}$ when the power is cut off, are connected to the power supply terminal $T_{IN}$ and the power supply terminal VDD of the digital circuit 20. The MOS transistors can be fabricated by the standard CMOS process and hence can be integrated on the same semiconductor chip as the digital circuit 20. Also, the MOS transistors hardly generate a voltage drop during the normal operation. Further, since the MOS transistors function as diodes when the power is cut off, the current can be prevented from flowing backward from the backup capacitor toward the power supply terminal. In addition, because of just two MOS transistors being employed, as compared with the known circuit using the oscillator, the charge pump and the MOS transistor, the oscillator and the charge pump are no longer required, while just one MOS transistor is added. Consequently, the number of necessary devices can be reduced and hence the circuit scale can be substantially halved.

Although the MOS transistors have been described as being p-MOS, the backup circuit of this embodiment may be constituted using n-MOS transistors.

The voltage detection circuit 12 enables the digital circuit 20 to be shifted into the power low-consumption state when the power is cut off, thus prolonging a time during which the backup capacitor C1 for backing up the source voltage can hold the source voltage.

Further, the delay circuit 14 is disposed to supply a reset signal to the digital circuit 20 after a delay time set by the delay circuit has lapsed from the restoration from the power cutoff. With that feature, even for the digital circuit having a risk of causing instability after the restoration from the power cutoff, it is possible to stabilize the digital circuit after the restoration.

The detailed configuration of the backup circuit of this embodiment will be described below with reference to FIG. 4.

Figure 4:
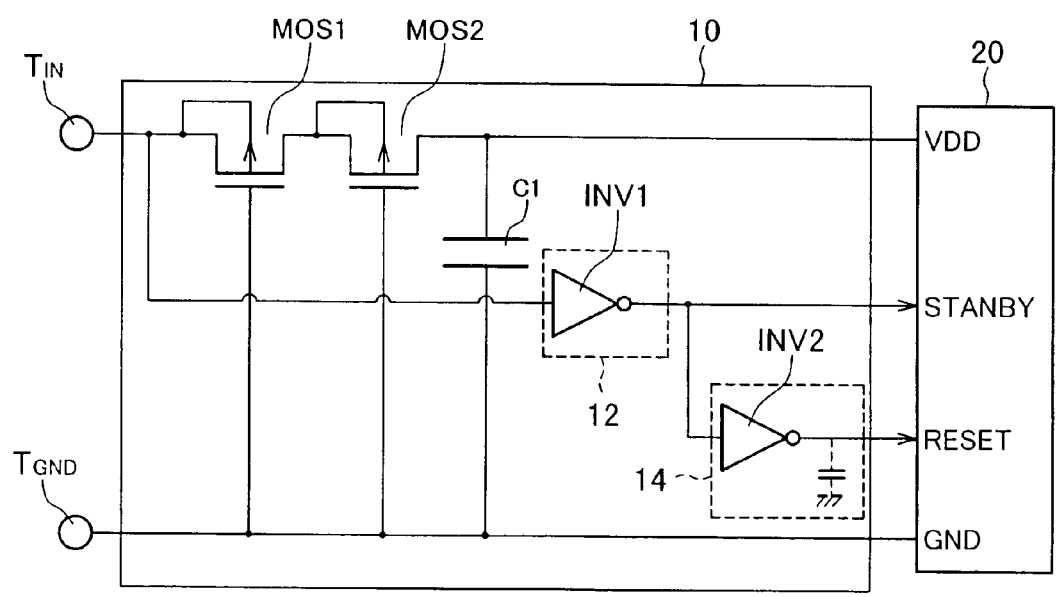
FIG. 4 is a circuit diagram showing the detailed configuration of the backup circuit according to the first embodiment of the present invention.

FIG. 4 is a circuit diagram showing the detailed configuration of the backup circuit according to the first embodiment of the present invention. Note that the same reference numerals as those in FIG. 1 denote the same components.

In FIG. 4, an inverter MOS circuit INV1 is used as the voltage detection circuit 12, and an inverter MOS circuit INV2 is used as the delay circuit 14. When the voltage V1 applied between the power supply terminals $T_{IN}$ and $T_{GND}$ has become 0 V at the time t1 in FIG. 3, an output of the inverter MOS circuit INV1 is changed from a low level to a high level. Upon the output of the inverter MOS circuit INV1 being changed to the high level, the digital circuit 20 is shifted to the standby state, i.e., to the power low-consumption state.

The inverter MOS circuit INV2 serves to delay an input signal and comprises a plurality of inverters that are connected in series. On condition that the output of the inverter MOS circuit INV1 is changed from a low level to a high level at the time t1 in FIG. 3 and the digital circuit 20 resets the internal CPU, etc. when the input signal at the reset terminal RESET is changed from a low level to a high level, the number of inverters constituting the inverter MOS circuit INV2 is set to an even number. In the digital circuit 20 that becomes unstable when it is restored from the power cutoff, the signal is delayed for a time during which the instability disappears. Assuming the delay time of one inverter to be 10 ns, for example, the number of inverters connected in series is set based on that delay time so as to ensure a total delay time required for the digital circuit 20 to stabilize. If the required delay time is long, a capacitor C2 may be connected to an output of the inverter MOS circuit INV2, as shown in FIG. 4, so that the delay time is prolonged by a time required for charging the capacitor C2.

According to this embodiment, as described above, when the voltage supplied from the power supply terminal drops, the current can be prevented from flowing backward from the backup capacitor toward the power supply terminal. Further, the backup circuit can be fabricated by the standard CMOS process. In addition, the circuit scale can be reduced.

The configuration and operation of a backup circuit according to a second embodiment of the present invention will be described below with reference to FIGS. 5 and 6.

Figure 5:
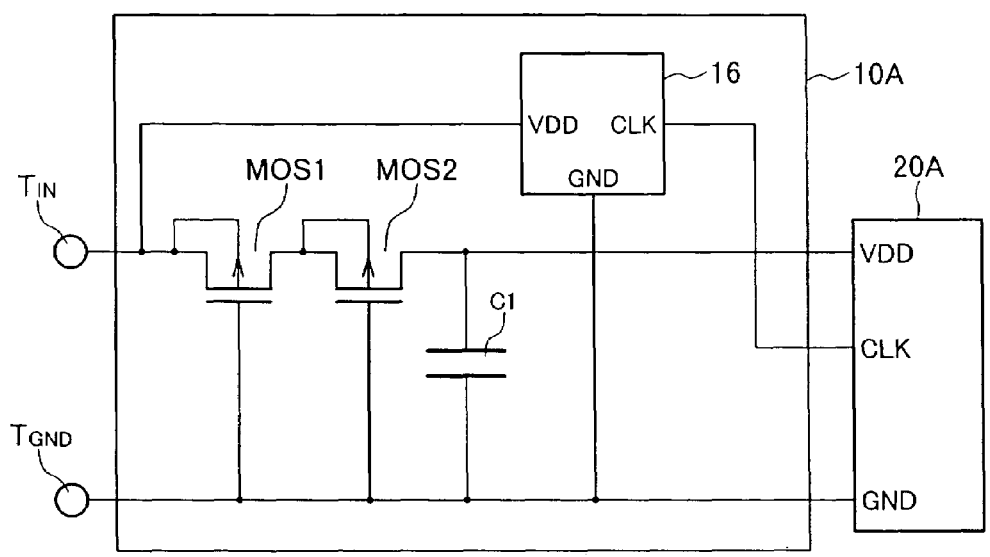
FIG. 5 is a circuit diagram showing the configuration of a backup circuit according to a second embodiment of the present invention.

FIG. 5 is a circuit diagram showing the configuration of the backup circuit according to the second embodiment of the present invention. FIG. 6 is a block diagram showing the configuration of a digital circuit backed up by the backup circuit according to the second embodiment of the present invention. Note that, in FIG. 5, the same reference numerals as those in FIG. 1 denote the same components.

In FIG. 5, a backup circuit 10A comprises p-MOS transistors MOS1, MOS2 connected in series, a backup capacitor C1, and an oscillator 16. The operations of the p-MOS transistors MOS1, MOS2 and the backup capacitor C1 are the same as those of the corresponding components shown in FIG. 1.

The oscillator 16 is operated with the voltage applied between the power supply terminals $T_{IN}$ and $T_{GND}$ and outputs a clock signal from a clock terminal CLK. The clock signal is supplied to a clock terminal CLK of a digital circuit 20A. When the voltage applied between the power supply terminals $T_{IN}$ and $T_{GND}$ drops, the oscillator 16 automatically stops oscillation.

Figure 6:
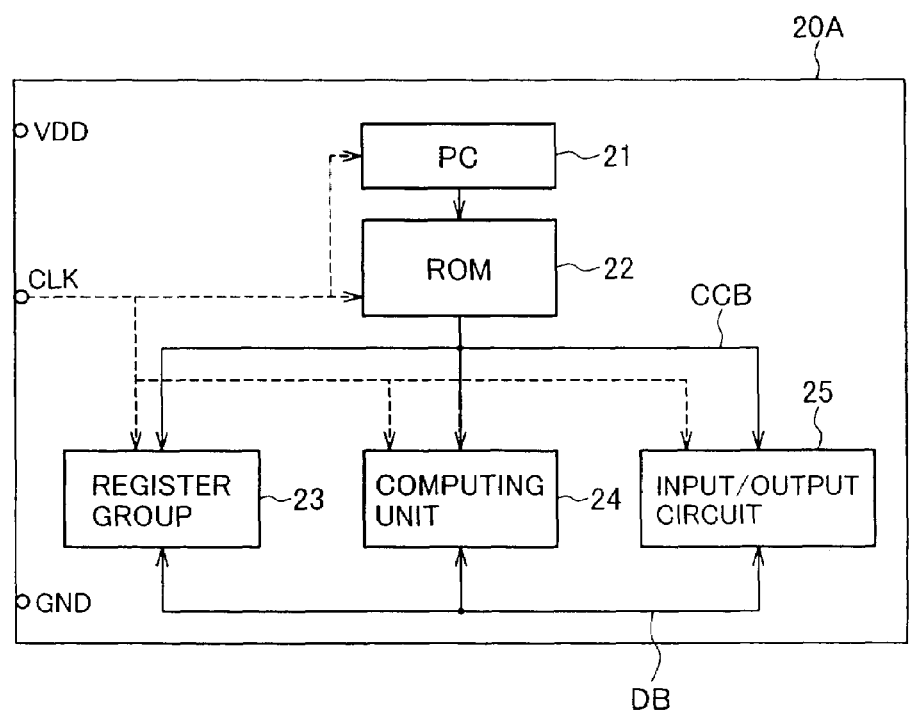
FIG. 6 is a block diagram showing the configuration of a digital circuit backed up by the backup circuit according to the second embodiment of the present invention.

In FIG. 6, the digital circuit 20A comprises a program counter 21, a ROM 22, a register group 23, a computing unit 24, and an input/output circuit 25. The program counter 21 cyclically repeats counts from 0 to a maximum value for management of program run. The ROM 22 outputs a program, which is stored therein beforehand, in accordance with an output of the program counter 21. Program code outputted from the ROM 22 is sent to the register group 23, the computing unit 24, and the input/output circuit 25 via a control code bus CCB. The register group 23 temporarily holds data, and the computing unit 24 executes computations. The input/output circuit 25 inputs and outputs data. Transfer of data among the register group 23, the computing unit 24, and the input/output circuit 25 is made via a data bus DB.

The clock signal inputted from the oscillator 16 in FIG. 5 is supplied to each of the program counter 21, the ROM 22, the register group 23, the computing unit 24, and the input/output circuit 25. Therefore, when the voltage applied between the power supply terminals $T_{IN}$ and $T_{GND}$ drops and the oscillator 16 automatically stops oscillation, the program counter 21, the ROM 22, the register group 23, the computing unit 24, and the input/output circuit 25 of the digital circuit 20A, which are supplied with operating clocks from the oscillator 16, also stop operations and come into the power low-consumption state.

Further, in the digital circuit 20A, the program counter 21 cyclically repeats counts such that the program is operated in a cyclic manner. Accordingly, even when the program operation runs away with power cutoff, it is positively restored through the cyclic operation of the program counter 21. In other words, the program operation can be restored without needing any reset operation.

With this embodiment, as described above, when the voltage supplied from the power supply terminal drops, the current can be prevented from flowing backward from the backup capacitor toward the power supply terminal. Further, the backup circuit can be fabricated by the standard CMOS process. In addition, the circuit scale can be reduced.

INDUSTRIAL APPLICABILITY

According to the present invention, it is possible to fabricate the backup circuit by the standard CMOS process and to reduce the circuit scale.

The invention claimed is:

1. A backup circuit disposed between a digital circuit including a storage circuit and a power supply terminal for supplying power to said digital circuit, and including a backup capacitor for supplying a backup voltage to said digital circuit when the power is cut off, thereby holding information stored in said storage circuit,
    wherein said backup circuit includes devices which are capable of being formed by a standard CMOS process, which are disposed between said power supply terminal and said backup capacitor, and which serve as resistors when the power is normally supplied to said power supply terminal, and as diodes each operating with a forward direction thereof defined as the direction from said digital circuit toward said power supply terminal when the power is cut off.

2. The backup circuit according to claim 1,
    wherein said devices are MOS transistors, and
    gate terminals of said MOS transistors are connected to a ground potential.

3. The backup circuit according to claim 2,
    wherein said MOS transistors are connected in series in plural number.

4. The backup circuit according to claim 1, further comprising:
    shift means for shifting said digital circuit to a power low-consumption state when a voltage at said power supply terminal drops to a level not higher than a predetermined voltage.

5. The backup circuit according to claim 4,
    wherein said shift means is voltage detecting means for detecting the voltage at said power supply terminal and shifting said digital circuit to a standby state when the voltage at said power supply terminal drops to a level not higher than the predetermined voltage.

6. The backup circuit according to claim 4,
    wherein said shift means is an oscillator driven by the voltage supplied from said power supply terminal, driving said digital circuit with a clock signal outputted from said oscillator, and stopping oscillation when the voltage supplied from said power supply terminal drops to a predetermined voltage.

7. The backup circuit according to claim 1, further comprising:
    reset means for resetting said digital circuit when a voltage at said power supply terminal drops to a level not higher than a predetermined voltage.

8. The backup circuit according to claim 7, wherein said reset means resets said digital circuit with a delay of a predetermined time after the voltage at said power supply terminal has dropped to a level not higher than the predetermined voltage.

* * * * *